(12) United States Patent
Hyvönen et al.

(10) Patent No.: US 6,974,724 B2
(45) Date of Patent: Dec. 13, 2005

(54) SHIELDED LAMINATED STRUCTURE WITH EMBEDDED CHIPS

(75) Inventors: Lassi Hyvönen, Helsinki (FI); Miikka Hämäläinen, Espoo (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 10/833,892

(22) Filed: Apr. 28, 2004

(65) Prior Publication Data

US 2005/0245001 A1    Nov. 3, 2005

(51) Int. Cl.[7] .............................................. H01L 21/44
(52) U.S. Cl. ...................... 438/107; 438/667; 257/728; 257/659
(58) Field of Search ............... 438/107, 667; 257/728, 774, 659

(56) References Cited

U.S. PATENT DOCUMENTS

| | | | | |
|---|---|---|---|---|
| 5,874,770 A | * | 2/1999 | Saia et al. ................... | 257/536 |
| 6,038,133 A | * | 3/2000 | Nakatani et al. ............ | 361/760 |
| 6,159,767 A | * | 12/2000 | Eichelberger ................ | 438/107 |
| 6,489,685 B2 | * | 12/2002 | Asahi et al. ................. | 257/774 |
| 6,538,210 B2 | * | 3/2003 | Sugaya et al. .............. | 174/258 |
| 6,855,892 B2 | * | 2/2005 | Komatsu et al. ............ | 174/256 |

* cited by examiner

*Primary Examiner*—Luan Thai
(74) *Attorney, Agent, or Firm*—Ware, Fressola, Van Der Sluys & Adolphson LLP (57) ABSTRACT

A laminated structure that can be used as an add-on card removably disposed on an electronic device, such as a mobile phone. The laminated structure has a number of layers laminated together for embedding one or more RF-chips. Advantageously, one or more layers are made of FR4 boards, each of which has a dielectric core layer between two electrically conductive foils. One of the layers has one or more openings for securing the embedded RF-chips with a bonding material such as epoxy. The electrically conductive foils on the inner layers can be etched or otherwise removed to form electrical circuits. Micro-vias can be provided through the various layers for interconnecting the electrical circuits and the RF-chips. The electrically conductive foils on the outer layers of the laminated structure can be used to provide electromagnetic shielding to the RF-chips.

22 Claims, 7 Drawing Sheets

SHIELDED LAMINATED STRUCTURE WITH EMBEDDED CHIPS

CROSS REFERENCES TO RELATED APPLICATIONS

The present invention is related to U.S. patent application Ser. No. 10/833,891, assigned to the assignee of the present invention, and filed even date herewith.

FIELD OF THE INVENTION

The present invention relates generally to embedded chips that use or provide radio-frequency signals and, more particularly, to chips embedded in add-on cards.

BACKGROUND OF THE INVENTION

Hand-held devices, such as mobile phones, require very large memory chips, especially when the mobile phones are equipment with a digital camera. A mobile phone is also equipped RF components. It is desirable and advantageous to provide a method for integrating the RF components, the memory chips and various other components into a package. However, packaging of integrated circuits (ICs) and external components (reference oscillators, for example) connected to the ICs has been one limiting factor in achieving high integration level. One problem is that heat generated by the ICs needs to be effectively conducted out of the chips. The other problem is the RF performance, which is deteriorated due to package with wire bond and lead frame inductance affecting the IC's resonance frequencies. Especially in case of BAW (bulk-acoustic wave) oscillator development, the package may be the real bottleneck for successful implementation of BAW oscillators.

The present invention is mainly concerned with the RF related problem, especially in highly miniaturized electronic packaging.

SUMMARY OF THE INVENTION

The present invention provides a method to integrate electronic chips in a shielded laminated structure, which can be used as part of an add-on card to be implemented in a hand-held device. Some of the electronic chips are RF-modules. These modules are required proper electromagnetic shielding, especially against EMC (electromagnetic compatibility).

Thus, the first aspect of the present invention provides a method for producing an electromagnetically shielded laminated structure having at least one RF-chip, said method comprising:
  securing the RF-chip in an embedding layer of the laminated structure, the embedding layer having a first side and an opposing second side;
  providing at least one first further layer to the first side of the embedding layer, wherein the first further layer has a first surface and a second surface, and the first surface is disposed adjacent to the first side of the embedding layer, forming a first interface layer;
  providing at least one second further layer to the second side of the embedding layer; wherein the second further layer has a first surface and a second surface, and the first surface is disposed adjacent to the second surface of the embedding layer, forming a second interface layer;
  providing an electrically conductive connector circuit in at least one of two interface layers;
  providing electrical connections between the RF-chip and the exterior of the laminated structure via the connector circuit in said at least one interface layer and a plurality of micro-vias through at least one of the further layers; and
  providing an electrically conductive layer on the second surface of the first further layer, and another electrically conductive layer on the second surface of the second further layer.

According to the present invention, the method further comprises:
  disposing a plurality of connection pads on the second surface of the first further layer spaced from the electrically conductive layer on the second surface of the first further surface so as to provide the electrical connections on the exterior of the laminated structure.

According to the present invention, the method further comprises:
  disposing an antenna structure on the second surface of the first further layer spaced from the electrically conductive layer on the second surface of the first further surface; and
  providing electrical connections between the antenna structure and the RF chip via the connector circuit.

According to the present invention, the method further comprises:
  providing at least one opening on the embedding layer for securing the RF-chip.

According to the present invention, the method further comprises:
  applying a bonding material in the opening on the embedding layer for securing the RF-chip in the opening.

According to the present invention, the method further comprises:
  disposing a plurality of electrically conductive bumps on the RF-chip such that the electrically conductive bumps are operatively connected to at least some of the micro-vias for providing the electrical connections.

According to the present invention, the method further comprises:
  providing one or more non-RF chips in the embedding layer;
  providing electrical connections at least between said one or more non-RF chips and the RF-chip via the connector circuit and the micro-vias.

According to the present invention, the method further comprises:
  providing one or more non-RF chips on the second surface of at least one of the first and second further layers; and
  providing electrical connections at least between said one or more non-RF chips and the RF-chips via the connector circuit and the micro vias.

The second aspect of the present invention provides an electromagnetically shielded laminated structure having at least one RF-chip, said structure comprising:
  an embedding layer for securing the RF-chip, the embedding layer having a first side and an opposing second side;
  at least one first further layer having a first surface and a second surface, the first surface disposed adjacent to the first side of the embedding layer for forming a first interface layer;

at least one second further layer having a first surface and a second surface, the first surface disposed adjacent to the second side of the embedding layer for forming a second interface layer;

an electrically conductive connector circuit disposed in at least one of the first and second interface layers;

a plurality of electrically conductive vias disposed in at least one of the first and second further layers so as to provide electrical connections between the RF-chip and the exterior of the laminated structure via the connector circuit;

a first electrically conductive layer disposed on the second surface of the first further layer; and a second electrically conductive layer disposed on the second surface of the second further layer.

According to the present invention, the laminated structure further comprises:

a plurality of connection pads disposed on the second surface of the first further layer spaced from the electrically conductive layer on the second surface of the first further layer so as to provide the electrical connections on the exterior of the laminated structure.

According to the present invention, the laminated structure further comprises:

a patch antenna structure disposed on the second surface of the first further layer spaced from the electrically conductive layer on the second surface of the first further layer; and at least one connection point through the first further layers so as to provide electrical connection between the antenna structure and the RF-chip through the connector circuit.

According to the present invention, the embedding layer comprises at least one opening for securing the RF-chip.

According to the present invention, a bonding material is provided in the opening for securing the RF-chip in the opening.

According to the present invention, the laminated structure further comprises:

one or more non-RF chips disposed in the embedding layer; and one or more further electrically conductive vias disposed in at least one of the first and second further layers so as to provide electrical connections between said one or more non-RF chips and the RF-chip.

According to the present invention, the laminated structure further comprises:

one or more non-RF chips disposed on the second surface of at least one of the first and second further layers; and one or more further electrically conductive vias disposed in one of the first and second further layers so as to provide electrical connections between said one or more non-RF chips and the RF-chip.

The third aspect of the present invention provides an electronic device. The electronic device comprises:

a device housing; and at least one add-on card disposed on the device housing for processing RF-signals, the add-on card comprising:

an embedding layer for securing at least one RF-chip for said RF signal processing, the embedding layer having a first side and an opposing second side;

at least one first further layer having a first surface and a second surface, the first surface disposed adjacent to the first side of the embedding layer for forming a first interface layer;

at least one second further layer having a first surface and a second surface, the first surface disposed adjacent to the second side of the embedding layer for forming a second interface layer;

an electrically conductive connector circuit disposed in at least one of the first and second interface layers;

a first electrically conductive layer disposed on the second surface of the first further layer;

a second electrically conductive layer disposed on the second surface of the second further layer;

a plurality of connection pads disposed on the second surface of the first further layer spaced from the electrically conductive layer on the second surface of the first further layer; and a plurality of electrically conductive vias disposed at least in one of the first and second further layers so as to provide electrical connections between the RF-chip and connection pads via the connector circuit.

According to the present invention, the add-on card further comprising:

one or more non-RF chips disposed in the embedding layer; and one or more further electrically conductive vias disposed in at least one of the first and second further layers so as to provide electrical connections between said one or more non-RF chips and the RF chip.

According to the present invention, the electronic device further comprises:

a patch antenna structure disposed on the second surface of the first further layer spaced from the electrically conductive layer on the second surface on the first further surface for conveying RF signals to and from the RF-chip.

According to the present invention, the electronic device further comprises:

a cover disposed in relation to the device housing; and an antenna structure disposed on the cover for conveying RF-signals to and from the RF-chip.

The electronic device can be a mobile phone, a communicator device or the like.

The fourth aspect of the present invention provides an add-on card for use in an electronic device. The add-on card comprises:

at least one RF-chip;

an embedding layer for securing the RF-chip, the embedding layer having a first side and an opposing second side;

at least one first further layer having a first surface and a second surface, the first surface disposed adjacent to the first side of the embedding layer for forming a first interface layer;

at least one second further layer having a first surface and a second surface, the first surface disposed adjacent to the second side of the embedding layer for forming a second interface layer;

an electrically conductive connector circuit disposed in at least one of the first and second interface layers;

a first electrically conductive layer disposed on the second surface of the first further layer;

a second electrically conductive layer disposed on the second surface of the second further layer;

a plurality of connection pads disposed on the second surface of the first further layer spaced from the electrically conductive layer on the second surface of the first further layer; and a plurality of electrically conductive vias disposed in at least one of the first and second further layers so as to provide electrical connections between the RF-chip and the connection pads via the connector circuit.

According to the present invention, the add-on card further comprises:

one or more non-RF chips disposed in the embedding layer; and one or more further electrically conductive vias disposed in at least one of the first and second further layers so as to provide electrical connections between said one or more non-RF chips and the RF-chip.

The present invention will become apparent upon reading the description taken in conjunction with FIGS. 1 to 12.

DETAILED DESCRIPTION OF THE INVENTION

RF components, including BAW (bulk acoustic wave) filters, require proper electrical shielding in order to perform optimally, especially against EMC (electromagnetic compatibility). When RF chips are integrated in a circuit card (or add-on card), it is advantageous to use sheets or boards that already have one or more electrically conductive layers for embedding and shielding the RF chips. FR4 can be used for such purposes, for example. An FR4 board has a dielectric core layer sandwiched between two copper foils, which are electrically conductive. The core can be machined to provide openings for embedding the chips. The copper foils can be used as electromagnetic shields. Furthermore, each copper foil can be etched or otherwise patterned to provide electrical connectors. An example of an FR4 board is shown in FIG. 4a. As shown in FIG. 4a, the board 160 has a core layer 172 sandwiched between two electrically conducting layers 162 and 164.

Figure 1:
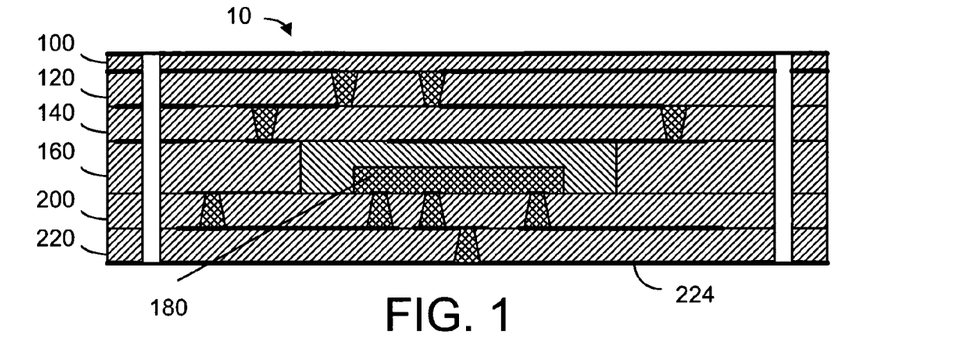
FIG. 1 is a schematic representation illustrating a shielded laminated structure having an embedded RF chip, according to the present invention.

A laminated structure with an embedded chip is shown in FIG. 1. As shown in FIG. 1, the laminated structure 10 is made of a plurality of layers or boards 100, 120, 140, 160, 200, 220, for example, and a chip 180 embedded in board 160. Some or all of the boards can be made from FR4 materials of the same thickness or with different thickness. Each of the boards is prepared separately, as shown in FIGS. 2a–2f.

As shown in FIG. 2a, the FR4 board 100 is stripped or etched so that only one electrically conductive layer 110 remains.

As shown in FIG. 2b, part of the electronically conductive layer 126 and part of the electrically conductive layer 128 on board 120 are removed to form conductor patterns. The conductor pattern formed from the conductive layer 126 is effectively an electrical circuit in the interface between the lower surface of the board 100 and the upper surface of the board 120. Likewise, the conductor pattern formed from the conductive layer 128 is an electric circuit in the interface between the lower surface of the board 120 and the upper surface of the board 140. Electrically conductive micro-vias 122, 124 are provided through the core layer 130. Some of the micro-vias are used to provide electrical connections between the electrically conductive layers 126 and 128.

Figure 4:
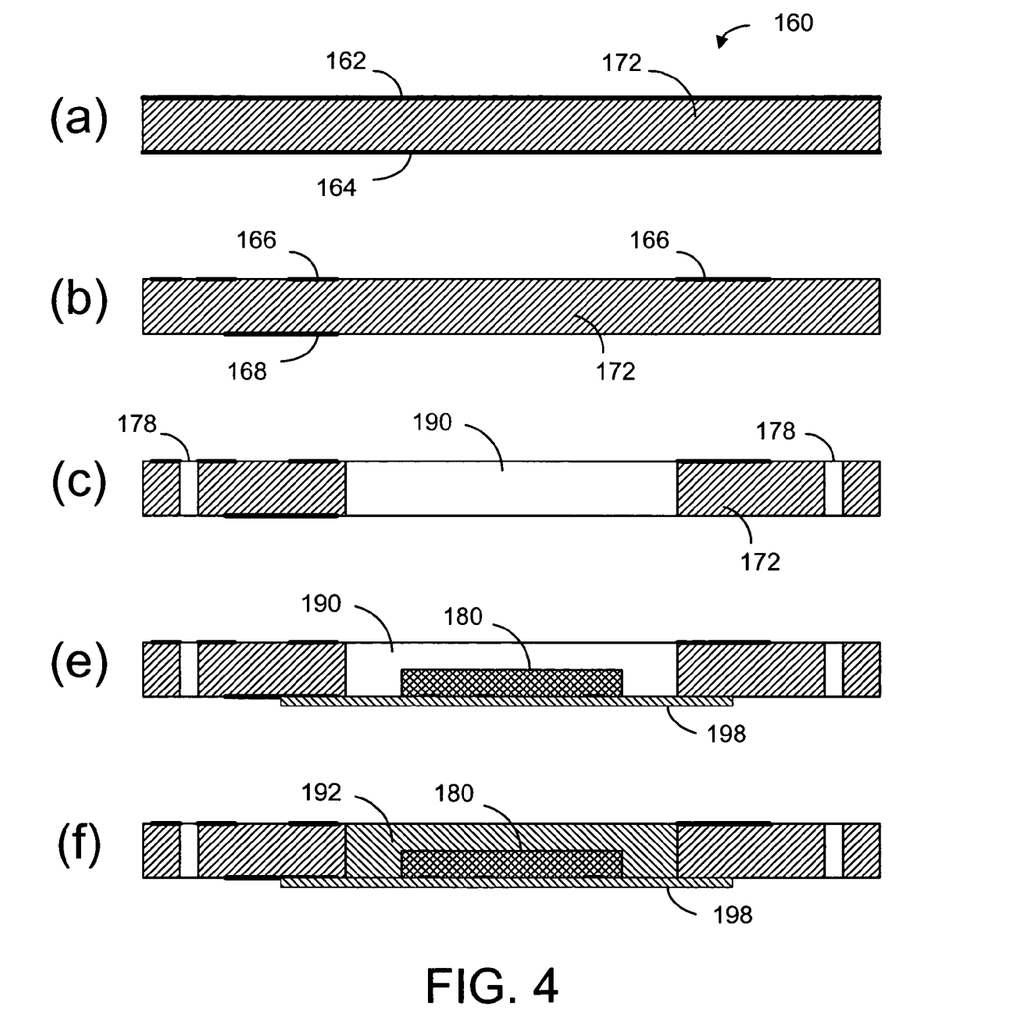
FIG. 4 is a schematic representation illustrating the various steps in making a particular layer in the shielded laminated structure.

As shown in FIG. 2c, the electrically conductive layers 146 and 148 on board 140 are mostly removed. The micro-vias 142, 144 are mainly used for electrical connection between boards. Board 160, as shown in FIG. 2d, has an embedded chip 180. The detailed procedure in preparing the board 160 is shown in FIG. 4.

As shown in FIG. 2e, three micro-vias 202, 203 and 204 are used to provide electrical connection for the bumps 182, 183 and 184 on the chip 180 on board 160. The upper conductive layer on board 200 is completely removed. Only one small section of the lower conductive layer 206 is left for providing an electrical connection between the micro-via 203 and the micro-via 222 on board 220 (FIG. 2f).

As shown in FIG. 2f, most part of the lower conductive layer 224 remains attached to the core layer 230. Part of the upper conductive layer is patterned for providing electrical connections between micro-vias.

When all these prepared boards 100, 120, 140, 160, 200, 220 are aligned and assembled into a single unit, as shown in FIG. 1, the conductive layers 110 and 224 can provide electromagnetic shielding.

Figure 3:
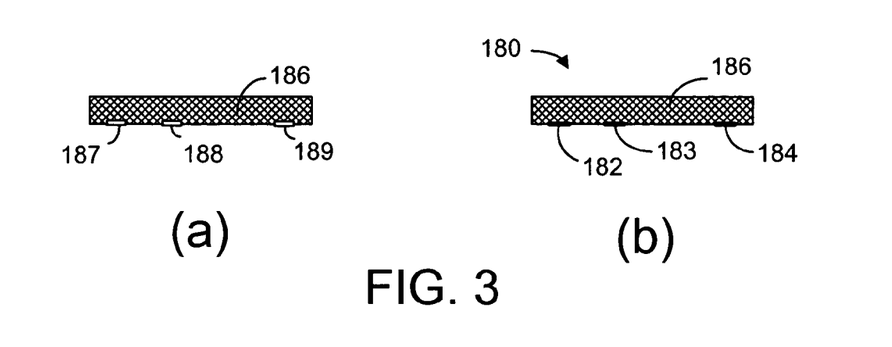
FIG. 3 is a schematic representation illustrating how the RF chip is prepared prior to embedding.

FIGS. 3a to 4f show how the chip 180 is embedded. FIG. 3a shows a die 186 having a plurality of bond pads 187, 188, 189. FIG. 3b shows three bumps 182, 183 and 184 grown on top of the bond pads in the prepared chip 180. FIG. 4a shows a "raw" FR4 board 160 having a core layer 172 sandwiched between two electrically conductive layers 162 and 164. The electrically conductive layers 162 and 164 are partly removed to form electrical connector patterns 166, 168 on the upper and lower sides of the core layer 172, as shown in FIG. 4b. An opening 190 larger than the chip 180 is made on a section of the core layer 172, as shown in FIG. 4c. The chip 180 is then accurately placed into the opening 190. An adhesive tape 198 is used to keep the chip 180 in placed, as shown in FIG. 4e. An epoxy mold 192 is cast to fix the chip 180 in the opening 190 permanently, as shown in FIG. 4f. After the tape 198 is removed, the processed FR4 board 160 is cleaned. The prepared layer of the laminated structure 10 is thus produced.

As can be seen in FIG. 1 and FIGS. 2d–2f, the micro-vias 202, 203 and 204 on board 200 electrically connect the bumps 182, 183 and 184 on the chip 180 to the exterior of the laminated structure 10 through the connector pattern 226 and the micro-via 222 on board 222. The electrically conductive layers 110 and 224 are used to provide the needed shield to the buried chip 180.

Figure 8:
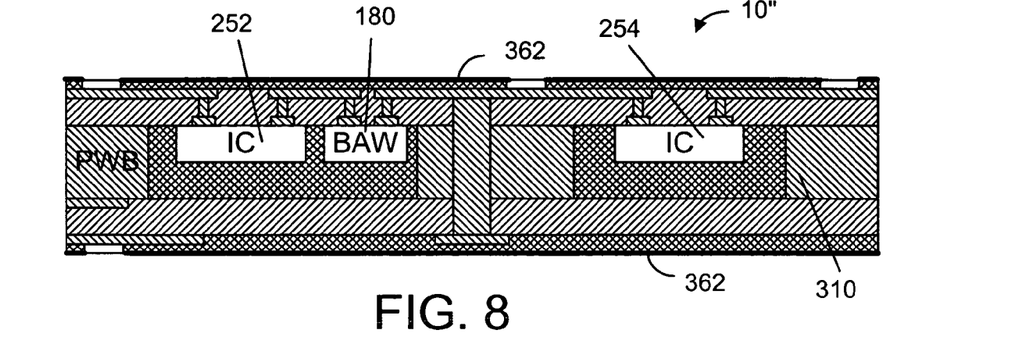
FIG. 8 is a schematic representation illustrating a laminated structure having a plurality of embedded chips.

Alternatively, bare boards can be used in place of some or all of the FR4 boards as built-up layers (see FIGS. 8 and 9a). Electrical connectors on the bare boards are printed using a standard PWB process or otherwise provided on the bare board surfaces. However, because copper foils are usually provided on a FR4 board as electrically conductive layers, it is advantageous to use FR4 boards for the top and bottom layers of the laminated structure 10.

Figure 5A:
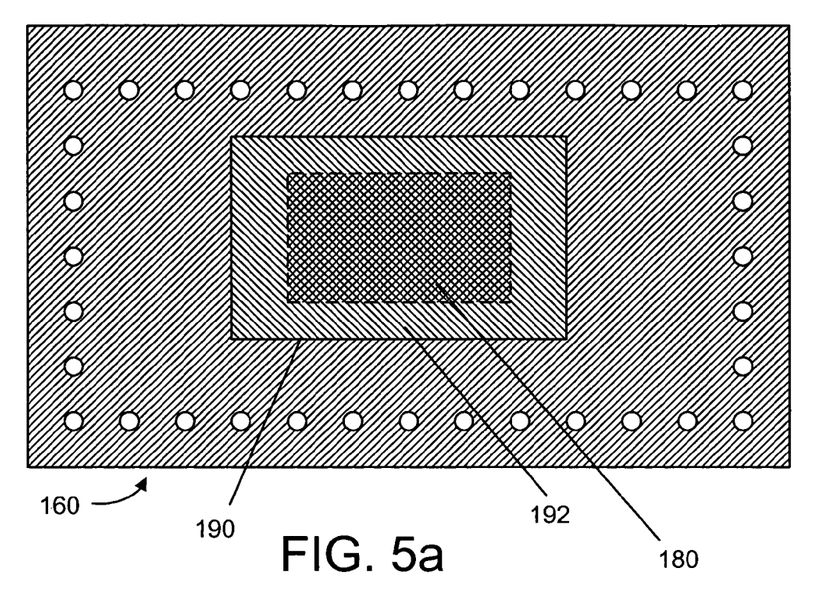
FIG. 5a is a schematic representation illustrating a cross sectional view of the layer having the RF chip.
Figure 5B:
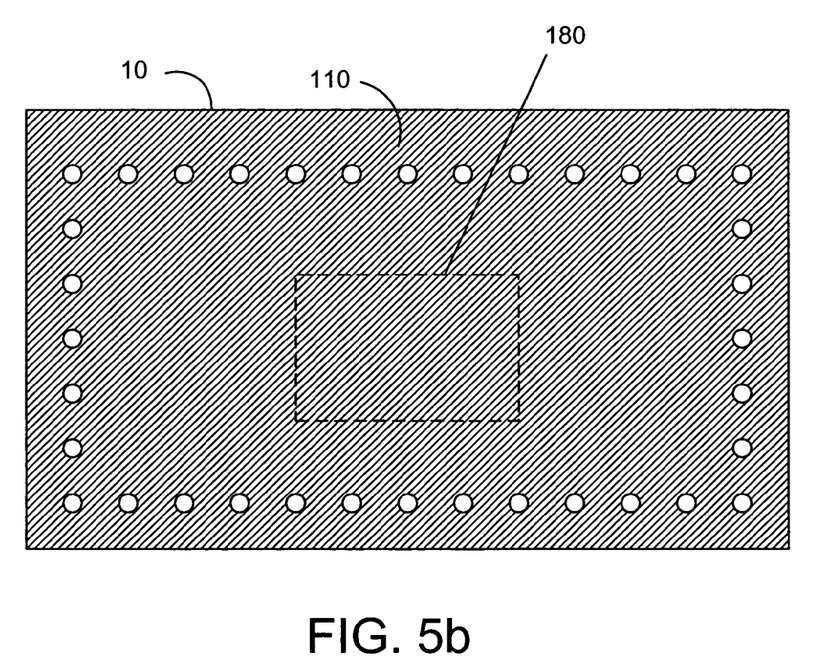
FIG. 5b is a schematic representation illustrating how the embedded RF chip is shielded.

FIG. 5a is a cross sectional view showing the chip 180 in relation to the opening 190, and the epoxy mold 192 around the chip 180. FIG. 5b is a top-view of the laminated structure 10. As can be seen in FIG. 5b, the top conductive layer 110 extends over a large area above the chip 180 in order to provide adequate electromagnetic shielding. Similarly, the bottom conductive layer 224 (see FIG. 1 and FIG. 2f) can be extended in the same way to provide adequate electromagnetic shielding to the chip 180.

Figure 6:
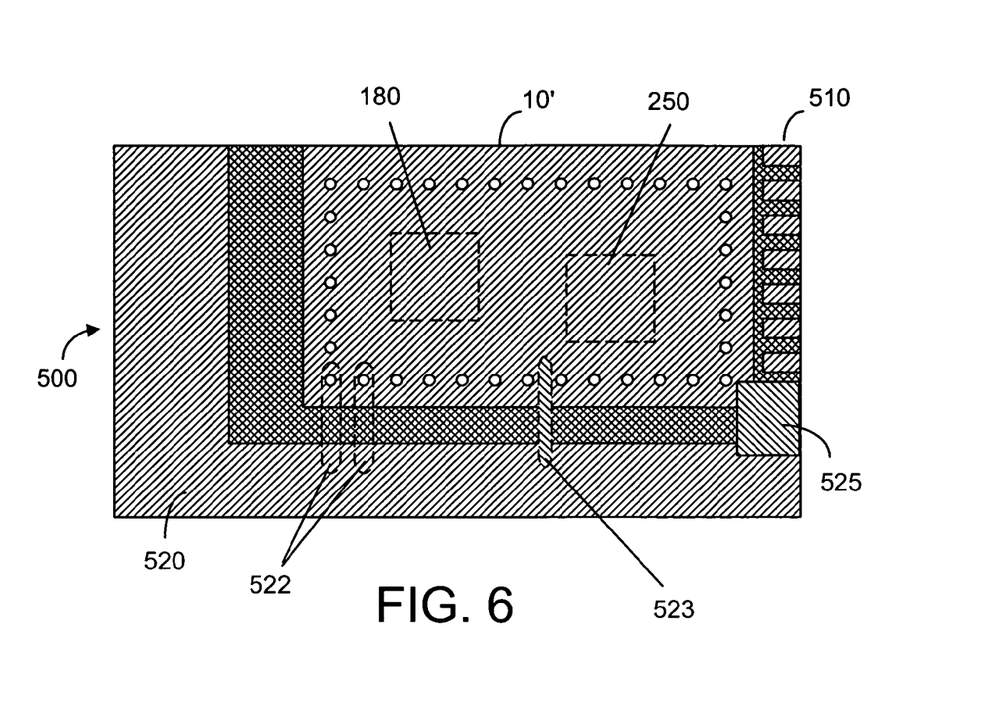
FIG. 6 is a schematic representation illustrating an add-on card having two embedded chips.

The laminated structure 10 or a similar one can be used as part of an add-on card in a hand held device, for example. The add-on card 500, as shown in FIG. 6, has a laminated structure 10', operatively connected to a connector 510. The connector 510 has a plurality of connection pads. It is advantageous to dispose the connector 510 for the interface at an edge of the add-on card. The laminated structure can have one or more RF chips 180 and one or more non-RF chips 250. The RF chip can be a BAW filter or oscillator, an RF transceiver, a Tx/Rx front end or an application processor. The non-RF chip can be a memory chip, for example. The connector 510 can be used to interconnect one or more other add-on cards (see FIG. 7c). The interconnection structure can be made conformal to the MIPI (mobile industry processor interface) standards, for example.

When the add-on card 500 is used in a wireless communication environment, such as WLAN (wireless local area network), Bluetooth, UWB (ultra wide-band), GPS (global positioning system), FM-radio, and RF transmitter and receiver, an antenna is usually required to support the frequency band in the wireless communication functions. Thus, it is advantageous to include an antenna 520 to convey signals to and from the RF chip 180. However, the antenna cannot be buried too deep in the laminated structure. It is possible to implement the antenna on part of the outer circumference of the card 500, on an electrically conductive layer, as shown in FIG. 6. As shown, the antenna connection points 522 are located near a corner of the laminated structure 10'. However, antenna feed can also come out from the chips to the antenna at a different location 523. As shown in FIG. 6, the ground of the chips is connected to the antenna ground 525. The chips 180, 250 are shielded against electromagnetic interference, for example, in the middle of the card 500. The shielding is also used to avoid EMC (electromagnetic compatibility) related problems. In additional, there should be an antenna switch, one or more duplexers embedded in the laminated structures as one or more RF chips. When the RF-function of the add-on card is not used, the antenna switch can be made open so that the card is effectively disconnected from the antenna connection points. It should be noted that the antenna 520 in FIG. 6 only represents one particular embodiment. There are many different antenna structures that can be integrated into the add-on card, according to the present invention. Moreover, there are many different ways to implement an antenna on an add-on card.

Figures 7A, 7B:
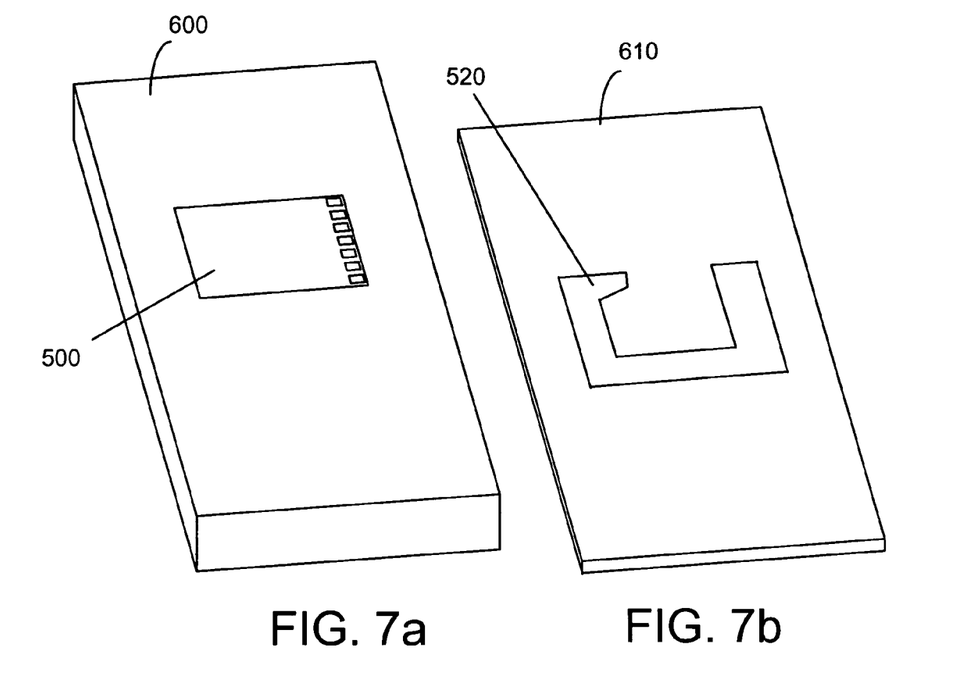
FIG. 7a is a schematic representation illustrating an add-on card disposed in a hand held device.
FIG. 7b is a schematic representation illustrating an antenna layer disposed on a cover of a hand held device.

FIG. 7a shows a hand-held device 600 having an add-on card 500 without the antenna. If the hand-held device 600 does not have an antenna or its existing antenna does not support the RF functions of the add-on card 500, it is possible to integrate an antenna 520 into a device cover 610 (B-cover, for example), as shown in FIG. 7b.

Figure 7C:
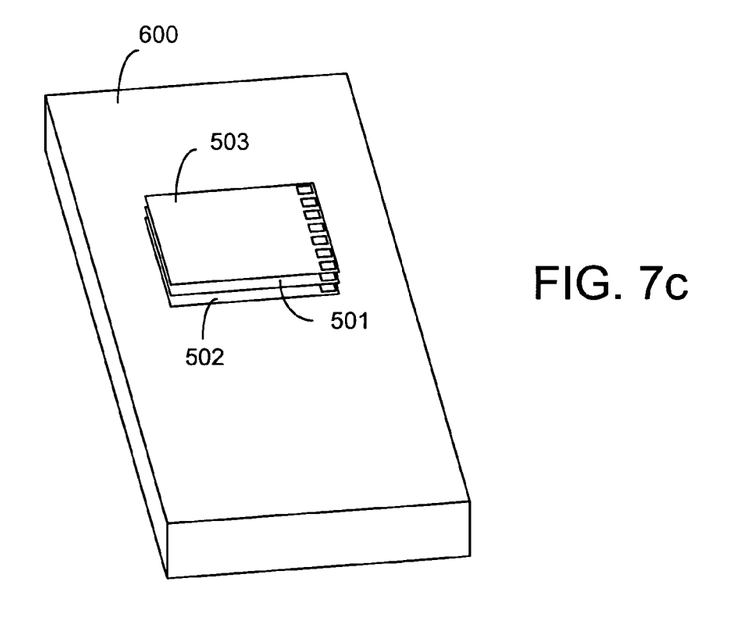
FIG. 7c is a schematic representation illustrating a stack of circuit cards disposed in a hand held device.

When more functions are desirable, it is possible to have more than one add-on cards in a hand-held device. As shown in FIG. 7c, add-on carded 501, 502, 503 are stacked on each other in the hand-held device 600.

Figure 7D:
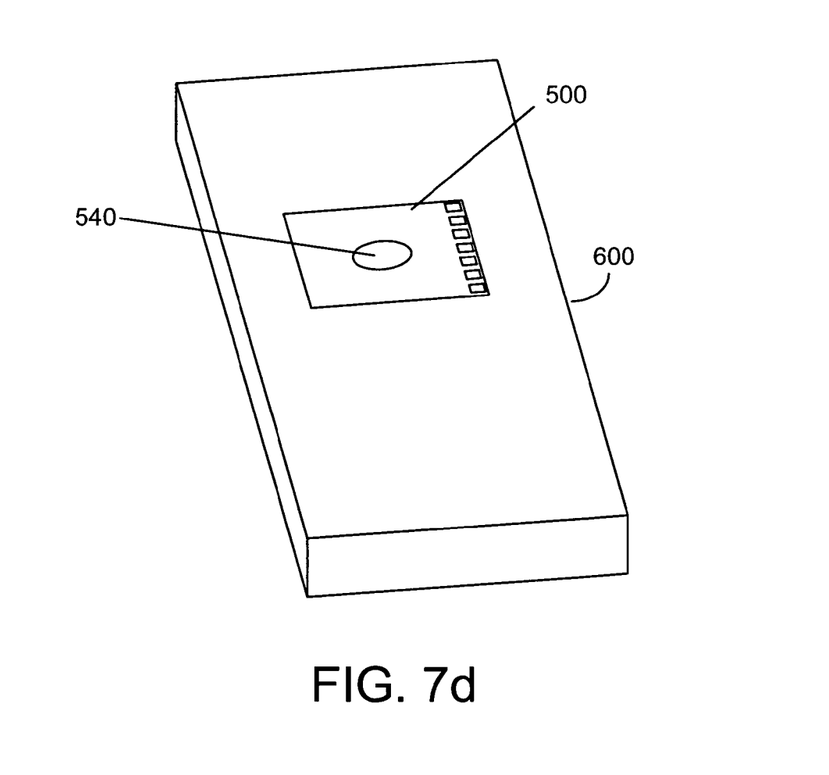
FIG. 7d is a schematic representation illustrating a camera disposed in relation to an add-on card on a hand held device.

Certain non-radio functions, such as image acquisition, gaming and sensing, are sometimes available on a hand-held device such as a mobile phone. These functions may require high-speed, RF or near RF signal processing. In order to implementing these non-radio functions on the hand-held device, it is possible to integrate the related devices on the add-on cards. For example, a camera 540 having a lens and an imaging sensor array can be integrated into the add-on card 500, as shown in FIG. 7d.

FIG. 8 shows a laminated structure 10", wherein a PWB (printed wire board) 310 is used for embedding a number of RF components including a BAW filter or oscillator 180 and two ICs 252, 254. In addition, a number of other laminate layers are put on both sides of the PWB 310 to protect the embedded components. Furthermore, an electrically conductive layer 362 is provided on each side of the laminated structure 10" for EMC shielding.

Figure 9:
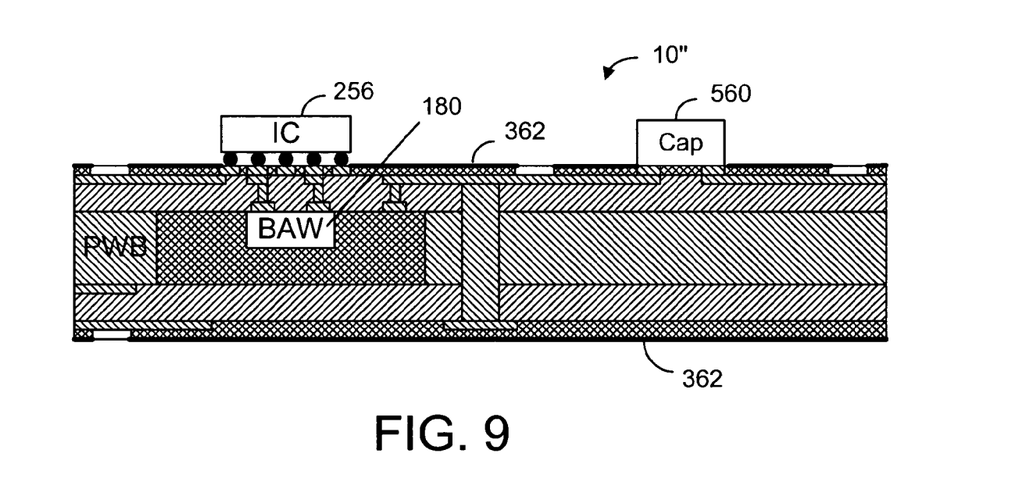
FIG. 9 is a schematic representation illustrating a laminated structure having surface-mounted components in addition to an embedded chip.

If the ICs do not contain RF components and they do not need electromagnetic shielding, they can be mounted on the surface of the laminated structure. As shown in FIG. 9, a capacitor 560 is surface-mounted at one location, and a non-RF IC 256 is surface-mounted at another location. However, the surface mounting of the IC 256 should not significantly affect the shielding on the BAW chip 180.

The BAW chip 180 and other BAW-related components mentioned in this disclosure may include thin-film BAW resonator (FBAR) devices or components. They can be BAW or FBAR filters, oscillators, resonators, duplexers or duplexer parts. The electromagnetic shield includes a shield against electromagnetic interference and to avoid EMC (electromagnetic compatibility) related problems.

Furthermore, the hand-held device for wireless communications can be a network component in DVB (digital video broadcast), BT (bluetooth), µM/DAB (digital audio radio broadcast), WLAN, UWB, GPS, W-CDMA/HSDPA (high speed downlink packet access), GSM/EDGE (global system for mobile/enhanced data GSM environment).

Figure 2:
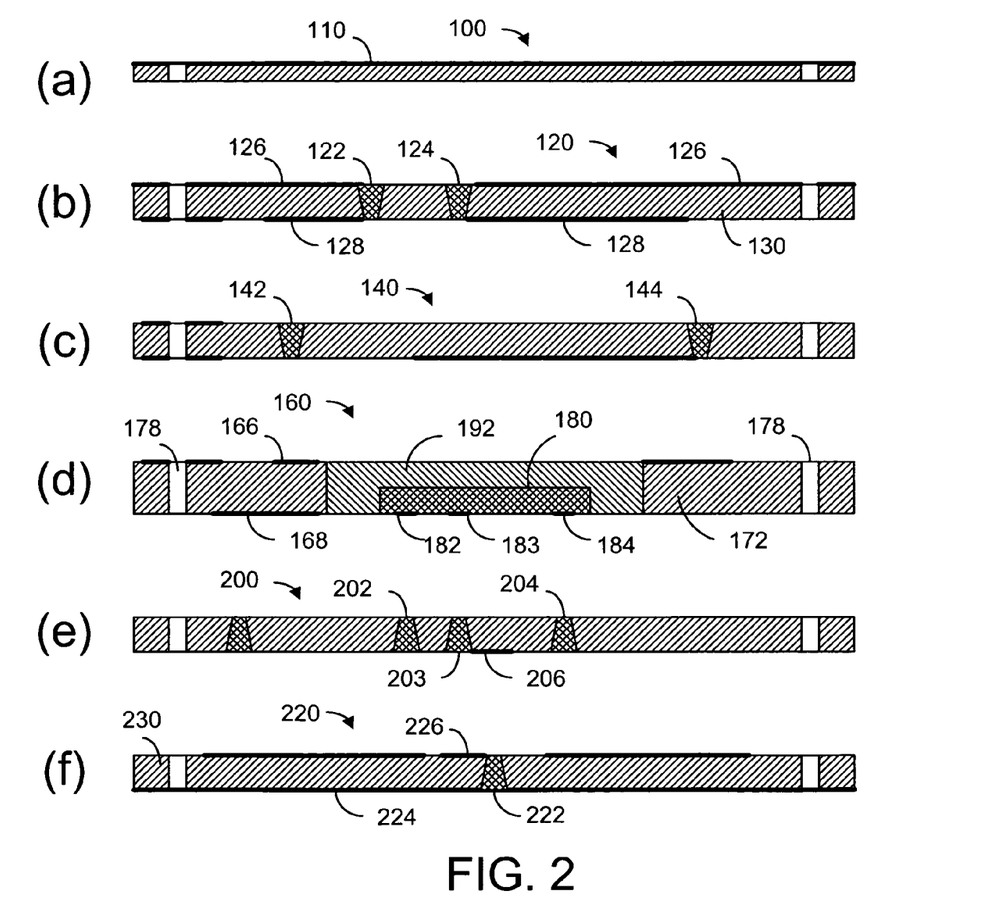
FIG. 2 is a schematic representation illustrating various layers in the shielded laminated structure of FIG. 1.

It should be noted that the embedding layer 160 as shown in FIGS. 1 and 2 can be made in a different process from that shown in FIG. 4. For example, the chip 180 having bumps 182, 183, 184 can be placed on a sheet of electrically conductive material such as copper 400, as shown in FIG. 10a. It is possible to dispose an electrically and thermally conductive layer 187 on the other side of the chip 180. A layer of dielectric material 410 is then applied over the copper sheet 400 including the chip 180, and another electrically conductive layer 420 is disposed over the dielectric layer 410, as shown in FIG. 10b. The copper sheet 400 is etched or otherwise patterned to become an electric circuit having a plurality of electrically conductive segments 402, leaving some of the bumps on the chip 180 exposed, as shown in FIG. 10c. A build-up layer 430 with micro-vias 436 and electrically conductive segments 432 is laminated to the embedding layer 410 to provide electrical conduits to the chip 180, as shown in FIG. 10d. A plurality of vias 412 can be made in the embedding layer 410 on top of the chip 180 so as to channel away the heat generated by the chip 180 through the electrically conductive layer 420. Moreover, another build up layer 440, such as an FR4 board, with an electrically conductive layer 450 is laminated to the top of the embedding layer 410 in order to provide an electromagnetic shield to the chip 180, as shown in FIG. 10d. Additionally, another FR4 layer (not shown), similar to the build-up layer 440, is laminated to the build-up layer 430 in order to provide another shield to the chip 180. In FIG. 10d, the vias 434 are infra-layer vias, which are used to make electrical connection between the electrically conductive elements within the same build-up layer. For example, the infra-layer vias 434 are used to connect the bumps 182, 184 (see FIG. 10c) to the electrically conduction segments 402. In contrast, regular vias 436 are used to make electrical connections between different build-up layers.

Alternatively, the chip 180 with or without the electrically and thermally conductive layer 187 is placed upside down, directly on top of the electrically conductive layer 400 as shown in FIG. 11a. A layer of dielectric material 410 is then applied over the layer 400 including the chip 180, as shown in FIG. 11b. A plurality of micro-vias 414 are made through the dielectric material for electrically contacting the bumps 182, 183 and 184 on the chip 180. A build-up layer 460 with a plurality of electrically conductive segments 462 is laminated to the embedding layer 410 to provide electrical conduits to the chip 180. The electrically conductive layer 470 that came with the build-up layer 460 is used as the electromagnetic shield on one side of the chip 180. On the other side of the chip 180, the electrically conductive layer 400 provides another electromagnetic shield. The electrically conductive layer 400 can also be used for channeling away the heat generated by the chip 180. A protective layer 480 can be laminated to the electrically conductive layer 400, if so desired.

Figure 10:
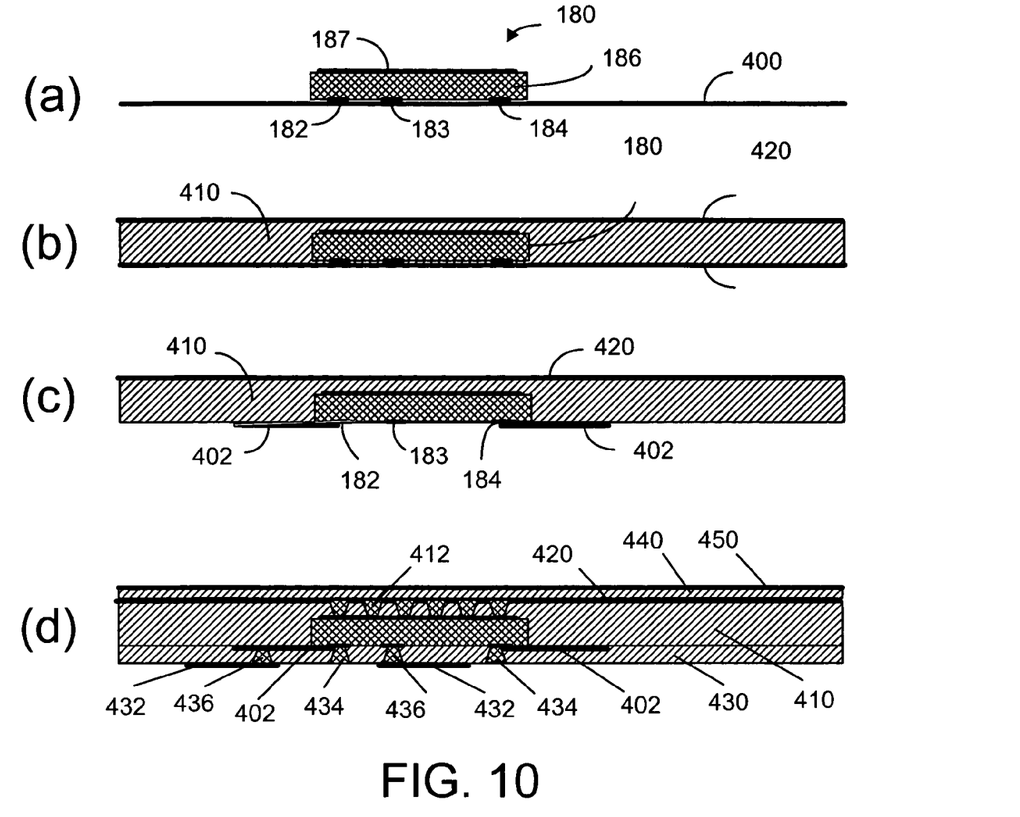
FIG. 10 is a schematic representation showing another method for making a shielded laminated structure.
Figure 11:
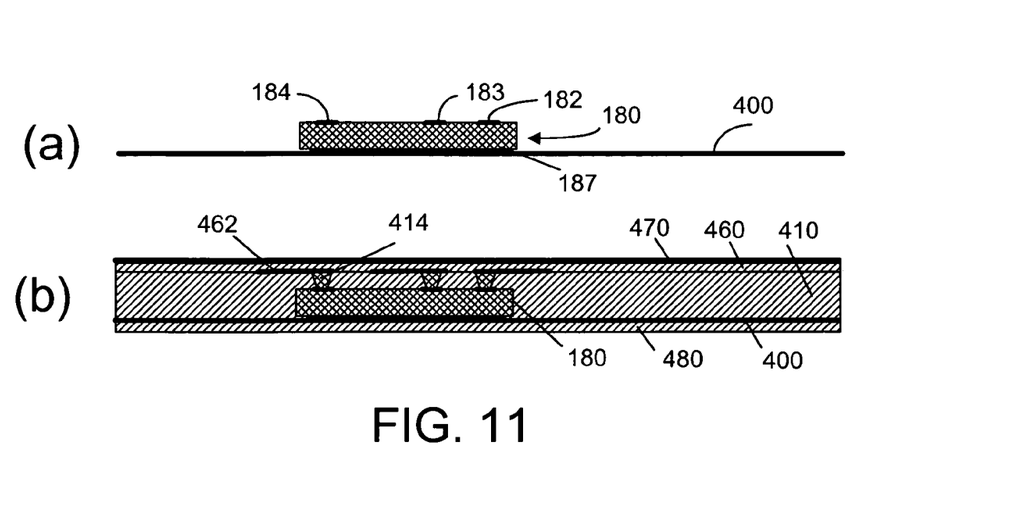
FIG. 11 is a schematic representation showing yet another method for making a shielded laminated structure.
Figure 12:
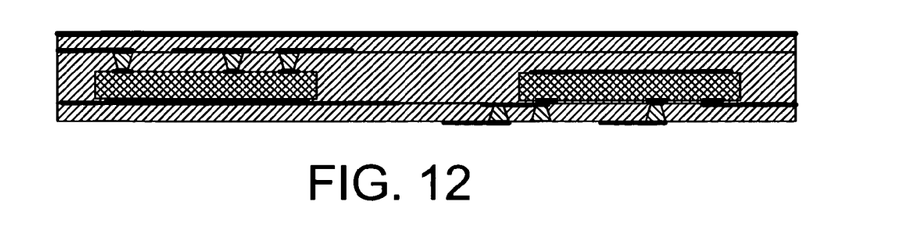
FIG. 12 is a schematic representation showing still another method for making a shielded laminated structure.

The embodiments as shown in FIG. 10 and FIG. 11 can be combined to make a shielded laminated structure in a different process, as shown in FIG. 12.

In general, the thickness of a thickest chip is approximately 400 $\mu$m. With all of the different layers including the PWB and build-up layers, it is possible to achieve a shielded laminated structure that is thinner than 1 mm. However, the thickness of the shielded laminated structure is dependent upon the number of build-up layers and the thickness of each layer. Each of the surfaces of the shielded laminated structure can have a sufficiently large unbroken ground planes above and under the embedded chip. Moreover, two or more chips can be embedded in the same core layer using the same shielding ground plane without significantly reducing the sturdiness of the laminated structure. All the electrical connections from the connection pads to the embedded chips can be achieved by micro-vias through the core layer, the build-up layers, and the printed or wired circuits on one or both surfaces of each of the layers.

An RF antenna can be added to one of the surfaces of the shielded laminated structure adjacent to the shielding ground plane of the buried chips. The antenna connection points can be made in a corner of the shielded laminated structure, for example. An antenna switch and related duplexers can also be incorporated in the laminated structure to enable or disable the RF functions. However, detached antennas such as those integrated on a B-cover can also be used in conjunction with the shielded laminated structure.

The shielded laminated structure as described above can be used as an add-on card for a hand-held electronic device, such as a mobile phone and a PDA. As the shielding ground planes are disposed on the outer surfaces of the add-on card, heat conducting materials can be made to contact the shielding ground planes in order to carry away the heat generated by the buried chips. Heat transfer is especially important when high power is needed to support in GSM multiple bands and other cellular system extensions.

In non-radio functions such as cameras, games and sensors, high-speed RF or near RF signal processing is usually required. This high-speed signal processing may be EMC sensitive on the one hand, and may be interference generating on the other hand. Thus, the use of shielded laminate structure is beneficial.

The shielded laminated structure, according to the present invention, can be designed for use in diversity in WCDMA, for example. The add-on cards can be used for increasing the data rate, for example.

In sum, the present invention uses PWB or FR4 technology to provide a method to integrate ICs and to connect ICs to one or more BAW chips in a laminated structure having one or more embedded chips. Micro-vias through various layers and electrically conductive connectors between layers are used to electrically connect the embedded chips to the exterior of the laminated structure. An electrically conductive layer is disposed on each side of the laminated structure to provide EMC shielding to the embedded chips. The laminated structures can be incorporated into add-on cards for use in a hand-held device. The add-on cards can be used in multi-mode, multi-frequency, multi-function and multi-application environments. With the add-on cards, the hand-held device can have the functions of double-band GSM, for example. Similarly, the hand-held device can have the functions of DVB, BT, FM/DAB, WLAN, UWB, GPS, WCDMA/HSDPA on three-bands, GSM/EDGE on four bands, and diversity in WCDMA. The shielded laminated structure, according to the present invention, renders it possible to integrate multiple chips in a single thin card with appropriate EMC shielding. The electrically conductive planes for electromagnetic shielding can be used in heat transfer as well.

Thus, although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A method for producing an electromagnetically shielded laminated structure having at least one RF-chip, the RF-chip having a surface area, said method comprising:

securing the RF-chip in an embedding layer of the laminated structure, the embedding layer having a first side and an opposing second side;

providing at least one first further layer to the first side of the embedding layer, wherein the first further layer has a first surface and a second surface, and the first surface is disposed adjacent to the first side of the embedding layer, forming a first interface layer;

providing at least one second further layer to the second side of the embedding layer; wherein the second further layer has a first surface and a second surface, and the first surface is disposed adjacent to the second surface of the embedding layer, forming a second interface layer;

providing an electrically conductive connector circuit in at least one of two interface layers;

providing electrical connections between the RF-chip and the exterior of the laminated structure via the connector circuit in said at least one interface layer and a plurality of micro-vias through at least one of the further layers; and providing a first electrically conductive layer on the second surface of the first further layer, the first electrically conductive layer having a first area larger than the surface of the RF-chip, and a second electrically conductive layer on the second surface of the second further layer, the second electrically conductive layer having a second area larger than the surface area of the RF-chip such that the RF-chip is positioned between the first and second electrically conductive layer with the first and second areas for electromagnetic shielding.

2. The method of claim 1, further comprising:
disposing a plurality of connection pads on the second surface of the first further layer spaced from the electrically conductive layer on the second surface of the first further surface so as to provide the electrical connections on the exterior of the laminated structure.

3. The method of claim 1, further comprising:
disposing an antenna structure on the second surface of the first further layer spaced from the electrically conductive layer on the second surface of the first further surface; and
providing electrical connections between the antenna structure and the RF chip via the connector circuit.

4. The method of claim 1, further comprising:
providing at least one opening on the embedding layer for securing the RF-chip.

5. The method of claim 4, further comprising:
applying a bonding material in the opening on the embedding layer for securing the RF-chip in the opening.

6. The method of claim 1, further comprising:
disposing a plurality of electrically conductive bumps on the RF-chip such that the electrically conductive bumps are operatively connected to at least some of the micro-vias for providing the electrical connections.

7. The method of claim 1, further comprising:
providing one or more non-RF chips in the embedding layer;
providing electrical connections at least between said one or more non-RF chips and the RF-chip via the connector circuit and the micro-vias.

8. The method of claim 1, further comprising:
providing one or more non-RF chips on the second surface of at least one of the first and second further layers; and
providing electrical connections at least between said one or more non-RF chips and the RF-chips via the connector circuit and the micro vias.

9. An electromagnetically shielded laminated structure having at least one RF-chip, the RF-chip having a surface area, said structure comprising:
an embedding layer for securing the RF-chip, the embedding layer having a first side and an opposing second side;
at least one first further layer having a first surface and a second surface, the first surface disposed adjacent to the first side of the embedding layer for forming a first interface layer;
at least one second further layer having a first surface and a second surface, the first surface disposed adjacent to the second side of the embedding layer for forming a second interface layer;
an electrically conductive connector circuit disposed in at least one of the first and second interface layers;
a plurality of electrically conductive vias disposed in at least one of the first and second further layers so as to provide electrical connections between the RF-chip and the exterior of the laminated structure via the connector circuit;
a first electrically conductive layer disposed on the second surface of the first further layer, the first electrically conductive layer having a first area larger than the surface area of the RF-chip; and
a second electrically conductive layer disposed on the second surface of the second further layer, the second electrically conductive layer having a second area large than the surface area of the RF-chip, such that the RF-chip is position between the first and second electrically conductive layers within the first and second areas for electromagnetic shielding.

10. The laminated structure of claim 9, further comprising:
a plurality of connection pads disposed on the second surface of the first further layer spaced from the electrically conductive layer on the second surface of the first further layer so as to provide the electrical connections on the exterior of the laminated structure.

11. The laminated structure of claim 9, further comprising:
a patch antenna structure disposed on the second surface of the first further layer spaced from the electrically conductive layer on the second surface of the first further layer; and
at least one connection point through the first further layers so as to provide electrical connection between the antenna structure and the RF-chip through the connector circuit.

12. The laminated structure of claim 9, wherein the embedding layer comprises at least one opening for securing the RF-chip.

13. The laminated structure of claim 12, wherein a bonding material is provided in the opening for securing the RF-chip in the opening.

14. The laminated structure of claim 9, further comprising:
one or more non-RF chips disposed in the embedding layer; and
one or more further electrically conductive vias disposed in at least one of the first and second further layers so as to provide electrical connections between said one or more non-RF chips and the RF-chip.

15. The laminated structure of claim 9, further comprising:
one or more non-RF chips disposed on the second surface of at least one of the first and second further layers; and
one or more further electrically conductive vias disposed in one of the first and second further layers so as to provide electrical connections between said one or more non-RF chips and the RF-chip.

16. An electronic device, comprising:
a device housing; and
at least one add-on card disposed on the device housing for processing RF-signals, the add-on card comprising:
an embedding layer for securing at least one RF-chip for said RF signal processing, the RF-chip having a surface area, the embedding layer having a first side and an opposing second side;

at least one first further layer having a first surface and a second surface, the first surface disposed adjacent to the first side of the embedding layer for forming a first interface layer;

at least one second further layer having a first surface and a second surface, the first surface disposed adjacent to the second side of the embedding layer for forming a second interface layer;

an electrically conductive connector circuit disposed in at least one of the first and second interface layers;

a first electrically conductive layer disposed on the second surface of the first further layer, the first electrically conductive layer having a first area larger than the surface area of the RF-chip;

a second electrically conductive layer disposed on the second surface of the second further layer, the second electrically conductive layer having a second area larger than the surface area of the RF-chip such that the RF-chip is positioned between the first and second electrically conductive layers within the first and second areas for electromagnetic shielding;

a plurality of connection pads disposed on the second surface of the first further layer spaced from the electrically conductive layer on the second surface of the first further layer; and a plurality of electrically conductive vias disposed at least in one of the first and second further layers so as to provide electrical connections between the RF-chip and connection pads via the connector circuit.

17. The electronic device of claim 16, wherein the add-on card further comprising:
one or more non-RF chips disposed in the embedding layer; and
one or more further electrically conductive vias disposed in at least one of the first and second further layers so as to provide electrical connections between said one or more non-RF chips and the RF chip.

18. The electronic device of claim 16, further comprising:
a patch antenna structure disposed on the second surface of the first further layer spaced from the electrically conductive layer on the second surface on the first further surface for conveying RF signals to and from the RF-chip.

19. The electronic device of claim 16, further comprising:
a cover disposed in relation to the device housing; and
an antenna structure disposed on the cover for conveying RF-signals to and from the RF-chip.

20. The electronic device of claim 16, comprising a mobile phone.

21. An add-on card for use in an electronic device, comprising:
at least one RF-chip, the RF-chip having a surface area;
an embedding layer for securing the RF-chip, the embedding layer having a first side and an opposing second side;
at least one first further layer having a first surface and a second surface, the first surface disposed adjacent to the first side of the embedding layer for forming a first interface layer;
at least one second further layer having a first surface and a second surface, the first surface disposed adjacent to the second side of the embedding layer for forming a second interface layer;
an electrically conductive connector circuit disposed in at least one of the first and second interface layers;
a first electrically conductive layer disposed on the second surface of the first further layer, the first electrically conductive layer having a first area larger than the surface area of the RF-chip;
a second electrically conductive layer disposed on the second surface of the second further layer, the second electrically conductive layer having a second area larger than the surface area of the RF-chip such that the RF-chip is positioned between the first and second electrically conductive layers between the first and second areas for electromagnetic shielding;
a plurality of connection pads disposed on the second surface of the first further layer spaced from the electrically conductive layer on the second surface of the first further layer; and
a plurality of electrically conductive vias disposed in at least one of the first and second further layers so as to provide electrical connections between the RF-chip and the connection pads via the connector circuit.

22. The add-on card of claim 21, further comprising:
one or more non-RF chips disposed in the embedding layer; and
one or more further electrically conductive vias disposed in at least one of the first and second further layers so as to provide electrical connections between said one or more non-RF chips and the RF-chip.

* * * * *